United States Patent
Lu et al.

(10) Patent No.: US 7,344,318 B2
(45) Date of Patent: Mar. 18, 2008

(54) OPTICAL INTERCONNECT WITH PASSIVE OPTICAL ALIGNMENT

(75) Inventors: Daoqiang Lu, Chandler, AZ (US); Henning Braunisch, Chandler, AZ (US); Bram Leader, Gig Harbor, WA (US); Mark B. Trobough, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/386,149

(22) Filed: Mar. 22, 2006

(65) Prior Publication Data

US 2007/0223865 A1 Sep. 27, 2007

(51) Int. Cl.
*G02B 6/30* (2006.01)
*G02B 6/26* (2006.01)
(52) U.S. Cl. ............................. 385/88; 385/49; 385/52
(58) Field of Classification Search ................ 385/52, 385/49, 65, 83, 88
See application file for complete search history.

(56) References Cited

U.S. PATENT DOCUMENTS

| 5,345,323 | A * | 9/1994 | Basavanhally et al. ....... 385/59 |
| 5,675,889 | A * | 10/1997 | Acocella et al. .............. 29/830 |
| 6,282,352 | B1 * | 8/2001 | Kato et al. .................... 385/92 |
| 6,741,778 | B1 * | 5/2004 | Chan et al. ................... 385/52 |
| 2004/0190825 | A1 * | 9/2004 | Kang et al. ................... 385/33 |
| 2006/0251360 | A1 | 11/2006 | Lu et al. |

OTHER PUBLICATIONS

Van Hove, A. et al., "Direct MT™ -compatible Connectorisation of VCSEL and LED-arrays to Plastic Optical Fiber Ribbon for Low Cost Parallel Datalinks," 49th Electronic Components & Technology Conference 1999.
Rits, O. et al., "Packaging solution with a 3-dimensional coupling scheme for direct optical interconnects to the chip," Proceedings Symposium IEEE/LEOS Benelux Chapter, 2004.
Bockstaele, R. et al., "A scalable parallel optical interconnect family," IO overview paper, Apr. 2004, pp. 1-10.
IMEC, "Deliverable 9.2, Status on the project Interconnect by Optics, year 1," Sep. 28, 2002. URL: http://www.intec.rug.ac.be/IO.
Bockstaele, R. et al., "Parallel optical interconnects with on-chip optical access, *Invited Paper*," SPIE Photonics Europe, Apr. 27, 2004. URL: http://www.intec.ugent.be/IO.
Bockstaele, R. et al., "Interconnect by Optics, *Project overview & Work on Plastic Optical Fibre*". URL: http://www.intec.ugent.be/IO, no date.
Bockstaele, R. et al., "The IO system demonstrator," Workshop on Parallel Optical Iinterconnects, 2004. URL: http://www.intec.ugent.be/IO.

* cited by examiner

*Primary Examiner*—Frank G. Font
*Assistant Examiner*—Charlie Peng
(74) *Attorney, Agent, or Firm*—Blakely, Sokoloff, Taylor & Zafman LLP (57) ABSTRACT

A coupler is passively aligned over a substrate, wherein the coupler is laterally aligned to an optoelectronic (OE) device coupled to the substrate. The coupler is placed on the substrate, wherein the coupler is vertically aligned to the OE device. The coupler is fixed to the substrate.

14 Claims, 8 Drawing Sheets

Before Insertion

OPTICAL INTERCONNECT WITH PASSIVE OPTICAL ALIGNMENT

BACKGROUND

1. Field

Embodiments of the present invention relate to the field of optical systems and more specifically, but not exclusively, to an optical interconnect with passive optical alignment.

2. Discussion of Related Art

In traditional optical packages, the coupling between a waveguide and an optoelectronic (OE) component is achieved using active alignment which is time-consuming and not compatible with high volume manufacturing. Active alignment involves measuring the intensity of an optical signal passing between the waveguide and the OE component for determining proper alignment. Also, polymeric waveguides, total internal reflection mirrors or metallized mirrors, and micro-lenses are generally used in these packages. The production and integration of these components into optical packages also complicates manufacturing.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION

Figure 1:
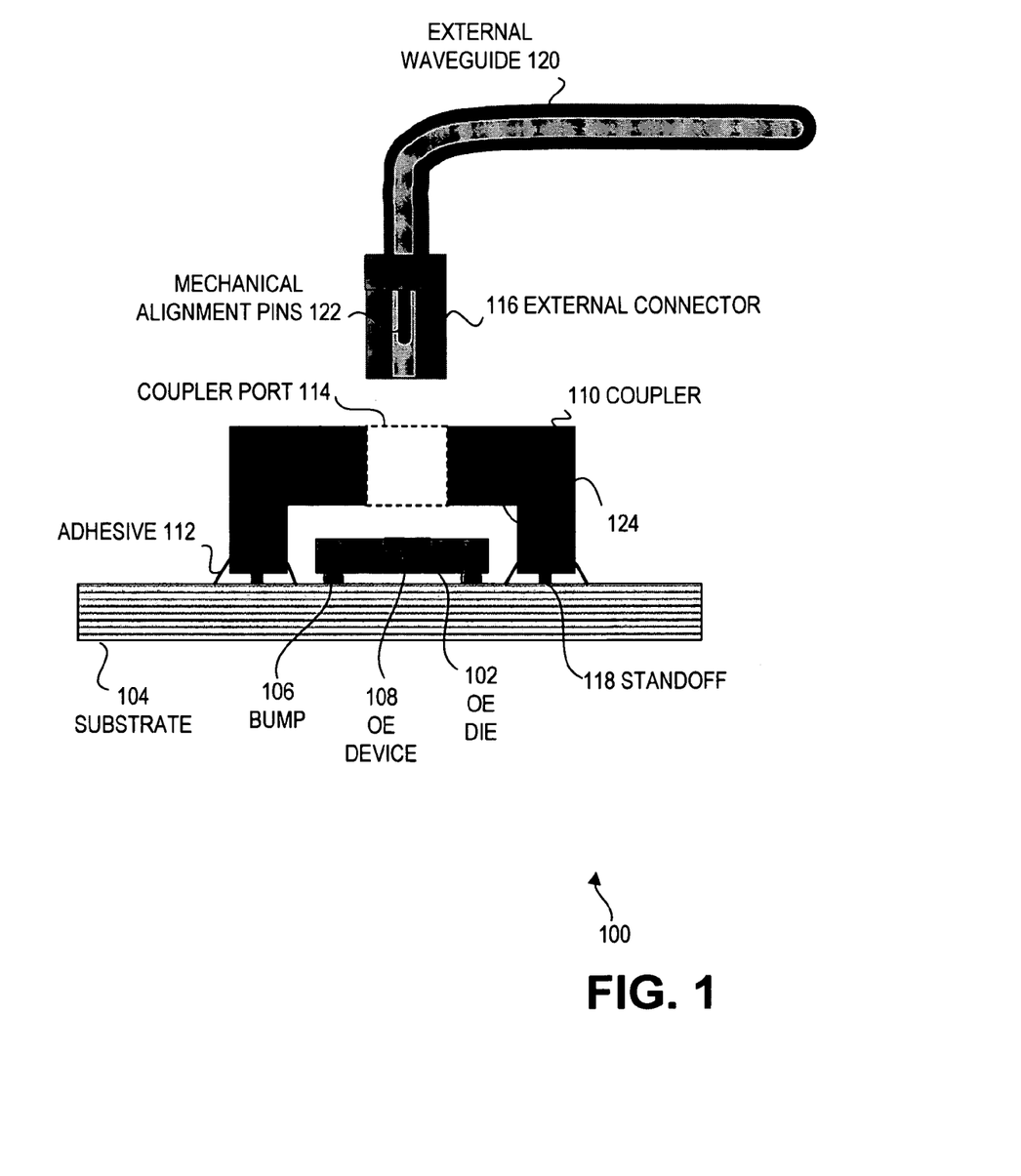
FIG. 1 is a side view of an unassembled optical interconnect according to an embodiment of the invention.

FIG. 1 illustrates a side view of an optical interconnect 100 that utilizes passive optical alignment according to an embodiment of the invention to align the active area of an OE device with a waveguide. In the illustrated embodiment, the interconnect 100 includes an OE die 102 mounted to a substrate 104 using electrical connections such as one or more electrically conductive bumps 106.

The OE die 102 includes an OE device 108 formed in the OE die 102. A coupler 110 is attached to the substrate 104 by an adhesive 112. The coupler 110 also includes a coupler port 114 for receiving an external connector 116. The coupler 110 may also include one or more standoffs 118 on the side of coupler 110 to be attached to the substrate 104. The external connector 116 may be coupled to an external waveguide 120. The external connector 116 may also include one or more mechanical alignment pins 122.

In one embodiment, an optical element, such as a lens, may be positioned between the OE device 108 and the external connector 116.

As shown in FIG. 1, the coupler 110 fits over the top of the OE die 102 and straddles OE die 102. The assembled optical connector 100, including the coupler 110, the substrate 104, and the OE die 102, may be considered as a packaged optoelectronic system.

In the illustrated embodiment, the OE die 102 includes a single OE device 108. In alternative embodiments, the OE die 102 may include an array of OE devices 108.

For some embodiments, the substrate 104 may be an organic substrate. For example, the substrate 104 may be a Flame Retardant 4 (FR-4) substrate, a Bismalimide Triazine (BT) substrate, or other, suitable organic or ceramic substrate.

The bumps 106 may be solder bumps. In alternative embodiments, the bumps 106 may be non-deformable bumps such as gold stud bumps and/or copper stud bumps, for example.

In embodiments of the present invention, the OE device 108 may include an optical receiving element, such as a photodetector or photodiode, for example. In alternative embodiments, the OE device 108 may include an optical transmitting element, such as a semiconductor laser (e.g., a Vertical Cavity Surface Emitting Laser (VCSEL)), or other suitable OE device such as an embedded waveguide with 90° coupler, for example.

For some embodiments, the coupler 110 may be precision molded plastic. For example, the coupler 110 may be an injection molded plastic coupler, a compression molded plastic coupler, a transfer molded plastic coupler, or the like.

Aspects of the coupler 110 may achieve lateral or horizontal alignment between the external waveguide 120 and the OE device 108. The molded plastic coupler or "MPC" 110 may be molded from plastic that provides proper dimensional tolerance of coupler 110. In one embodiment, the coupler 110 may be aligned laterally with respect to OE device 108 with a tolerance of approximately 5 micrometers (µm). Because of the precision molding technique used to make the coupler 110, the coupler 110 may be molded within tolerances to precise dimensions in large quantities for high-volume production.

In one embodiment, there may be fiducials (not shown) on the coupler 110 conducive to automated pattern recognition. The fiducials may be used to align the coupler 110 with the OE device 108 so that the external waveguide 120 is aligned with the active area of the OE device 108. In some embodiments, fiducials may be formed on the bottom surface 124 of coupler 110 (excluding standoffs 118) or the bottom side of standoffs 118. In other embodiments, the active area of the OE die 102, such as the OE device 108, may be used as a fiducial. In still other embodiments, there may be fiducials on the substrate 104, which may be used as global references for placing both the OE die 102 and the coupler 110.

In yet another embodiment, solder self alignment during reflowing of the bumps 106 when they are solder bumps may align the OE die 102 with respect to substrate 104.

The adhesive 112 may be any suitable adhesive capable of bonding the bottom of the coupler 110 to the substrate 104, such as an ultraviolet (UV)-curable adhesive, for example.

For some embodiments, the adhesive 112 flows along the surface of the substrate 102 under the coupler 110 and around the standoffs 118 forming a strong bond between the coupler 110 and the substrate 104. In one embodiment, the standoffs 118 are narrower than the sidewalls of the coupler 110 to allow the adhesive 112 to move around the base of the coupler 110.

The coupler port 114 may constrain the movement of the external connector 116 within the coupler 110. In one embodiment, the coupler port 114 may control at least two translational degrees of freedom and/or two rotational degrees of freedom. For example, the coupler port 114 may prevent the external connector 116 from moving left and/or right, or swaying, within the optical interconnect 100. The coupler port 114 may prevent the external connector 116 from moving forward and/or backward, or surging, within the optical interconnect 100. The coupler port 114 may prevent the external connector 116 from tilting up and/or down, or pitching, within the optical interconnect 100. The coupler port 114 may prevent the external connector 116 from tilting side-to-side, or rolling, within the optical interconnect 100.

The external connector 116 may be a male MT (multi-terminal) fiber optic connector capable of coupling an optical signal from one place to another, such as from the OE device 108 to the waveguide 120 and vice versa. In one embodiment, the external connector 116 may be modified as described below with reference to FIG. 3 and FIG. 7.

For some embodiments, the standoffs 118 may be precision molded as part of the coupler 110 and may be used for precisely setting a vertical gap of predetermined size between the OE device 108 and the bottom of the external connector 116. Thus, a gap between the active region of the OE device 108 and the waveguide 120 may be precisely controlled.

The external waveguide 120 may be any suitable device capable of guiding an optical signal from the active region of the OE device 108 to a destination. For some embodiments, the external waveguide may be a single optical waveguide, such as a multimode and/or single mode optical fiber. Alternatively, the external waveguide 120 may be an array of optical waveguides, such as a ribbon or bundle of multimode and/or single mode optical fibers, or a planar waveguide array.

Figure 2:
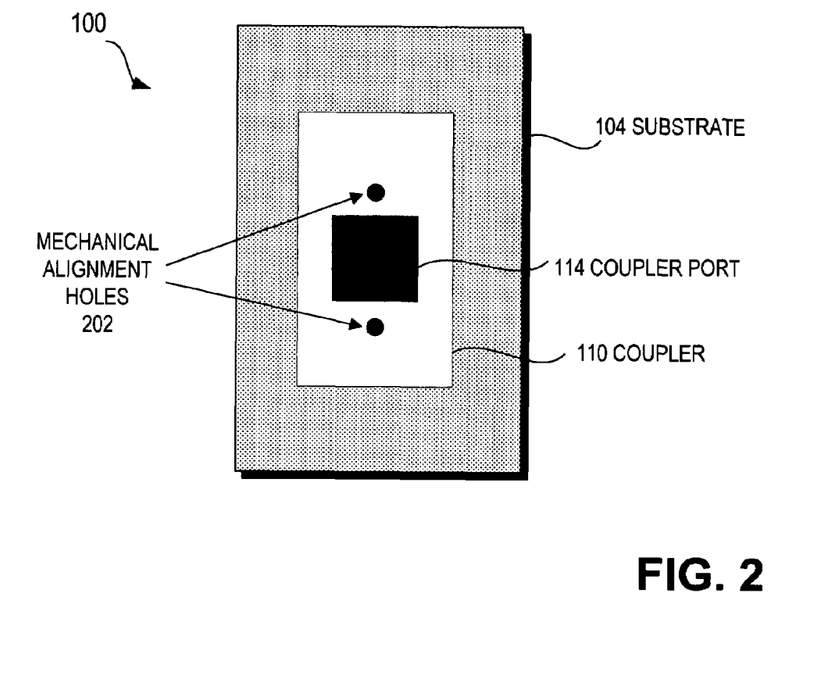
FIG. 2 is a top view of an optical interconnect according to an embodiment of the present invention.

The mechanical alignment pins 122 of the external connector 116 may be used to align the external connector 116 with the coupler 110. FIG. 2 illustrates a top view of the optical connector 100 according to an embodiment of the present invention showing how the mechanical alignment pins 122 may mate with mechanical alignment holes 202 to align the external connector 116 with the top of coupler 110. In the illustrated embodiment, the coupler 110 is attached to the substrate 104. The two mechanical alignment holes 202 receive the two corresponding mechanical alignment pins 122 of the external connector 116. While FIG. 2 shows mechanical alignment holes 202 on laterally opposite sides of coupler port 114, it will be understood that embodiments of the present invention are not limited to this configuration or to two mechanical alignment pins 122 as shown.

The mechanical alignment pins 122 along with the mechanical alignment holes 202 may constrain the movement of the external connector 116 within the coupler 110. In one embodiment, the mechanical alignment pins 122 along with the mechanical alignment holes 202 may control at least one degree of freedom. For example, the mechanical alignment pins 122 along with the mechanical alignment holes 202 may prevent the external connector 116 from turning left and/or right, or yawing, within the optical interconnect 100.

Figure 3:
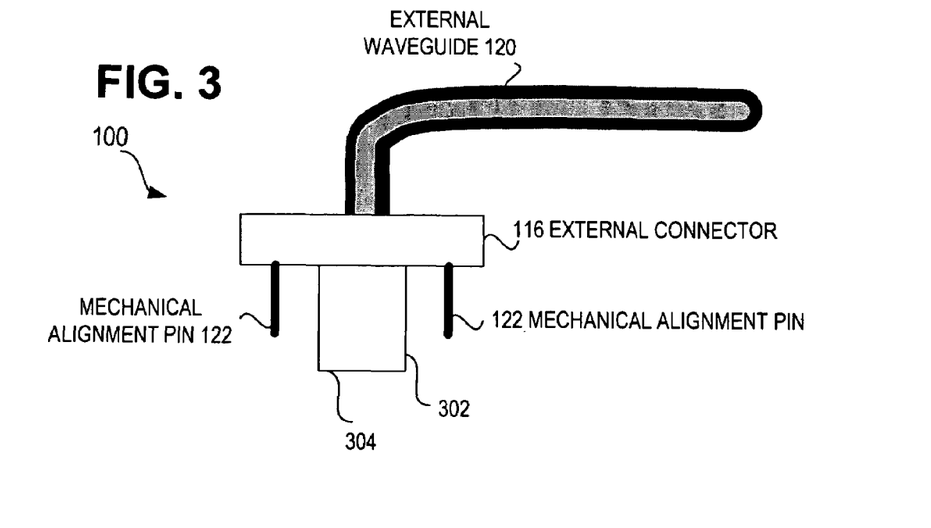
FIG. 3 is a side view of an external connector according to an embodiment of the present invention.

FIG. 3 illustrates a side view of the external connector 116 according to an embodiment of the present invention showing the external connector with the two mechanical alignment pins 122 and being coupled to the external waveguide 120. In the illustrated embodiment, the external connector 116 also includes an engagement section 302, which is to fit into the coupler port 114.

In the illustrated embodiment, the external connector 116 is modified in at least one respect in that mechanical alignment pins 122 are shorter than the engagement section 302 of external connector 116 and do not extend past a bottom surface 304 of the engagement section 302 while in a standard male MT connector, such mechanical alignment pins extend beyond the bottom of the connector.

In one embodiment, the mechanical alignment holes 202 may be used as fiducials for passive alignment of the external waveguide 120 with the active region of the OE device 108.

Figure 4:
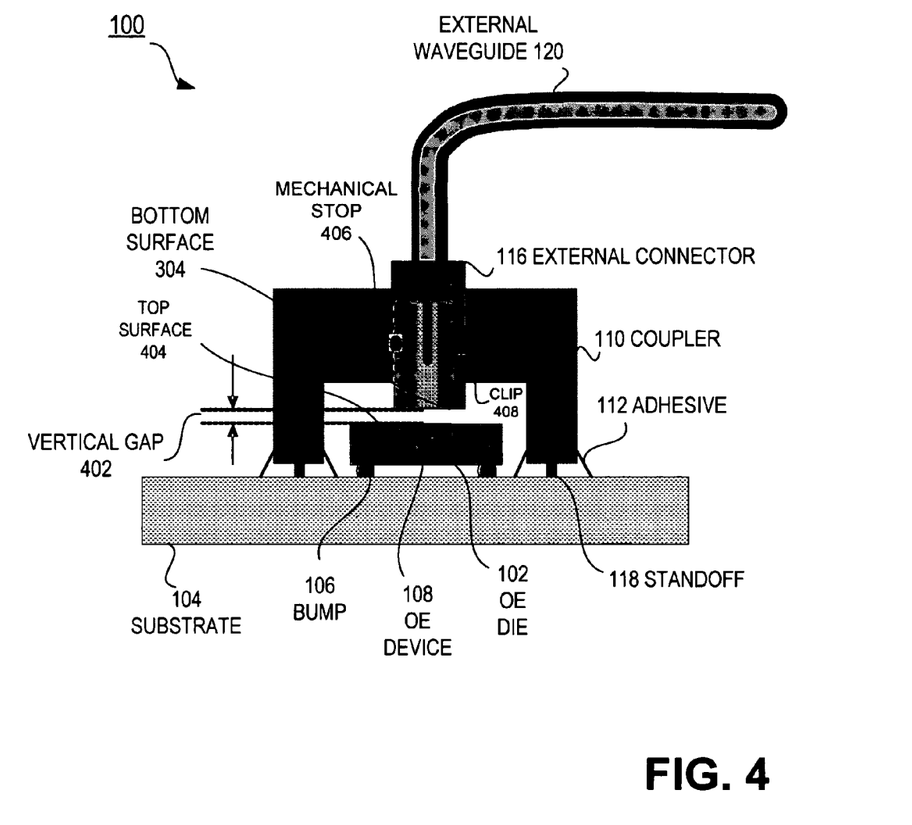
FIG. 4 is a side view of an assembled optical interconnect having a precision distance between an OE device and a waveguide according to an embodiment of the present invention.

The coupler 110 may achieve longitudinal or vertical alignment between the external waveguide 120 and the OE device 108. For some embodiments, a vertical gap between the external waveguide 120 and the active region of the OE device 108 may be precisely controlled. FIG. 4 illustrates the optical interconnect 100 as assembled in which the external connector 116 has been inserted into the coupler port 114 according to an embodiment of the present invention. In the illustrated embodiment, there is a vertical gap 402 between the bottom surface 304 of the engagement section 302 and a top surface 404 of the OE device 108.

For some embodiments, the vertical gap 402 is precisely controlled by controlling the height of the coupler 110, including the standoffs 118, during the coupler 110 molding process. For other embodiments, the vertical gap 402 is precisely controlled by controlling the size of the bumps 106 to control the standoff height of the OE die 102. The bumps 106 thus may provide a consistent distance between the substrate 104 and the OE die 102, which in turn results in the vertical gap 402 being predictable.

In one embodiment of the present invention, the coupler 110 may be constructed so that external connector 116 may be physically stopped by the coupler 110 during insertion of the external connector 116. For example, the coupler 110 may have a physical/mechanical stop 406 in or around the coupler port 114 to physically prevent the external connector 116 from passing a certain point during insertion. Such a physical stop may result in the desired vertical gap 402.

In an alternative embodiment, a suitable retention mechanism using, for example, a spring loaded clip 408 may be provided to fix the external connector 116 in position. In this embodiment, the retention mechanism may maintain vertical gap 402 when the optical interconnect 100 is assembled.

In one embodiment, vertical gap 402 may be approximately 10 micrometers with a tolerance of ±5 micrometers. Of course, the vertical gap 402 may have other dimensions depending on the dimensions of the coupler 110, the dimensions of the bumps 106, and/or the dimensions of the OE die 102, for example.

Figure 5:
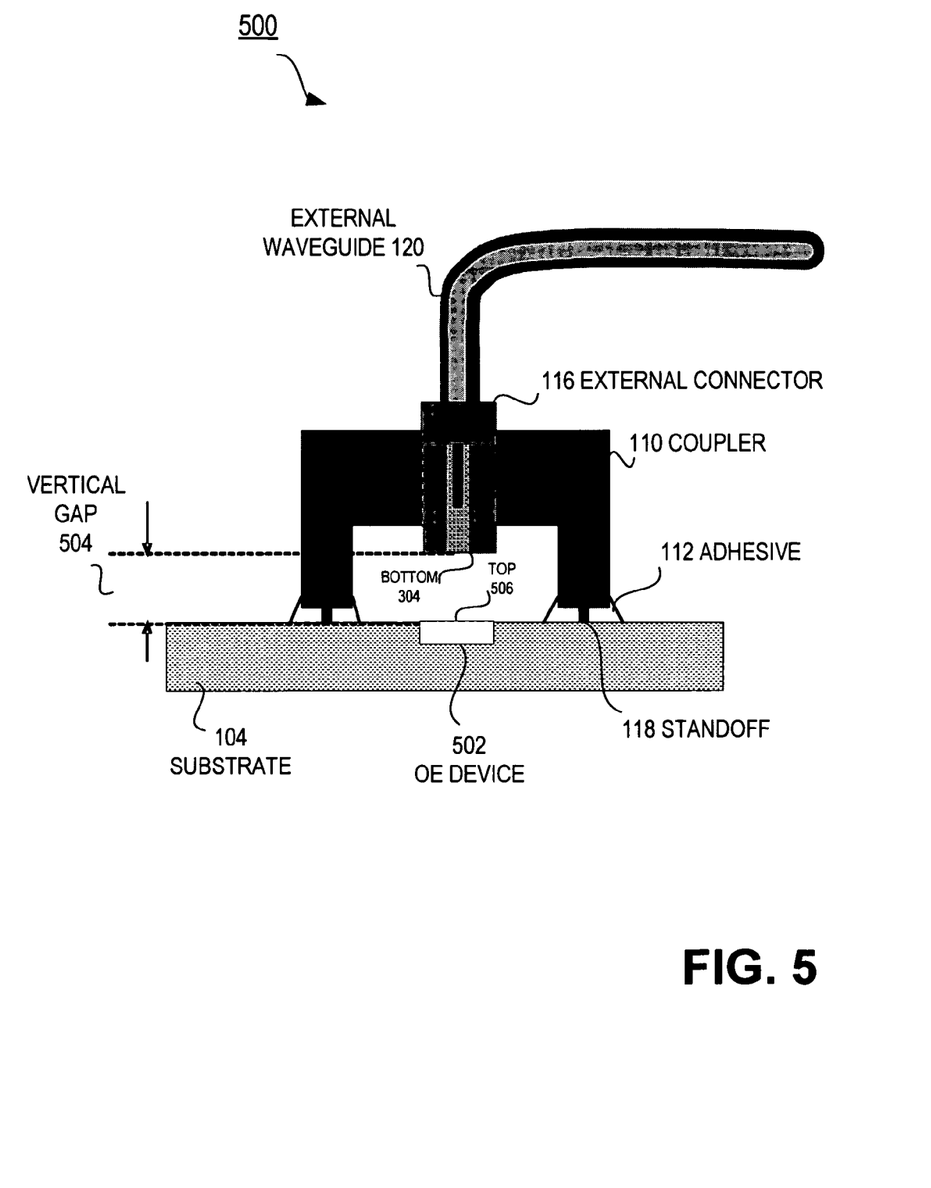
FIG. 5 is a side view of an assembled optical interconnect having a precision distance between an OE device and a waveguide according to an alternative embodiment of the present invention.

FIG. 5 is a side view of an assembled optical interconnect 500 according to an alternative embodiment of the present invention. In the illustrated embodiment, the interconnect 500 includes an OE device 502 disposed in the substrate 104. The coupler 110 is attached to the substrate 104 by the adhesive 112, which has flowed under the bottom of the coupler 110 and around the standoffs 118 so that the coupler 110 is attached to the substrate 104.

In the illustrated embodiment, there is a vertical gap 504 between the bottom surface 304 of the external connector 116 and a top surface 506 of the OE device 502. For some embodiments, the vertical gap 504 is precisely controlled by controlling the height of the coupler 110 during the coupler 110 molding process, by a physical stop in or around the coupler port 114, and/or a spring loaded clip as described above with reference to FIG. 4. The vertical gap 504 and the coupler 110 may be used to laterally and vertically align the external connector 116 and thus the external waveguide 120 with the OE device 502.

Figure 6:
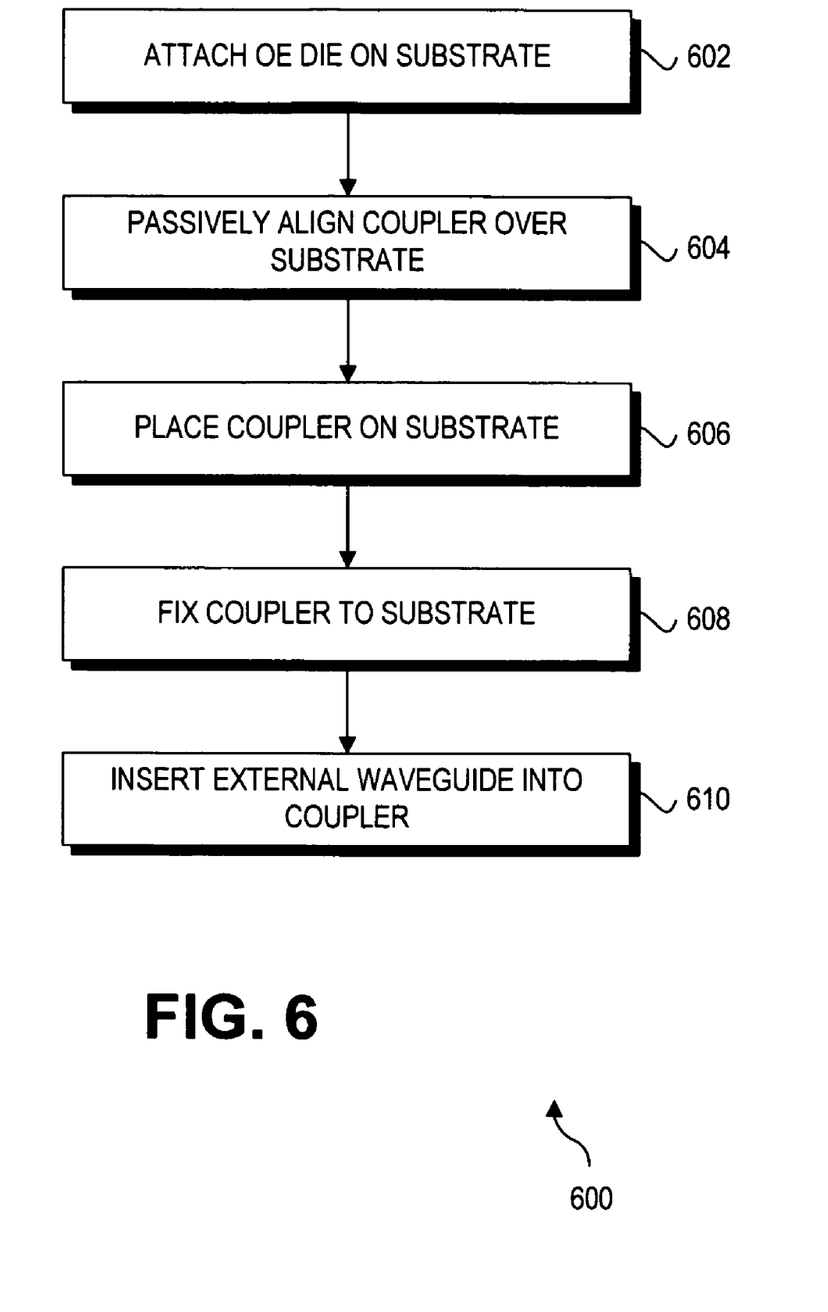
FIG. 6 is a flowchart illustrating the logic and operations of assembly of an optical interconnect according to an embodiment of the present invention.

FIG. 6 is a flowchart illustrating a method 600 of assembling an optical interconnect and passively aligning an OE device with a waveguide according to an embodiment of the present invention.

In a block 602, the OE die having the OE device is attached to the substrate.

In a block 604, a coupler is passively aligned over the substrate. The coupler may be picked and aligned using a precision pick-'n'-place tool. The tool may have a relatively high alignment accuracy. In one embodiment, the pick-'n'-place tool may have an alignment accuracy of approximately 5 μm. The coupler may be aligned with respect to the active areas of the OE device to ensure good alignment between the coupler and the OE device.

In a block 606, the coupler may be placed using the pick-'n'-place tool described above with respect to block 604.

The placement of the coupler also results in passive vertical alignment of the coupler to the waveguide as a vertical gap of predetermined size will result upon insertion of the external connector.

In one embodiment, the predetermined vertical gap is created by forming one or more standoffs on the coupler. The standoffs have predetermined height associated with the desired vertical gap.

In another embodiment, the predetermined vertical gap is created by disposing non-deformable electrically conductive bumps on the OE die and disposing the OE die on the substrate. The bumps have a predetermined radius associated with the desired vertical gap.

In another embodiment, the predetermined vertical gap is created by disposing a spring-loaded clip in the coupler port. The spring-loaded clip maintains the external connector at a predetermined distance from the OE die. The predetermined distance is associated with the desired vertical gap.

In yet another embodiment, the predetermined vertical gap is created by disposing a mechanical stop in the coupler port. The mechanical stop prevents the external connector from being inserted into the coupler beyond a predetermined distance. The predetermined distance is associated with the desired vertical gap.

In one embodiment, the predetermined vertical gap is created by forming one or more standoffs on the external connector. The standoffs have predetermined height associated with the desired vertical gap.

In a block 608, the coupler is fixed to the substrate. This can be achieved by disposing and curing an adhesive.

In a block 610, the external waveguide coupled to a connector is inserted into the coupler. It is to be noted that when implementing the block 610 one does not have to be concerned with vertical or horizontal alignment of the external connector with the OE device because the attachment of the coupler to the substrate in relation to the OE device has already accomplished the horizontal alignment and the vertical gap accomplishes vertical alignment. From a user's perspective, the external connector is merely inserted into the coupler to vertically and horizontally align the OE device with the waveguide.

Figure 7:
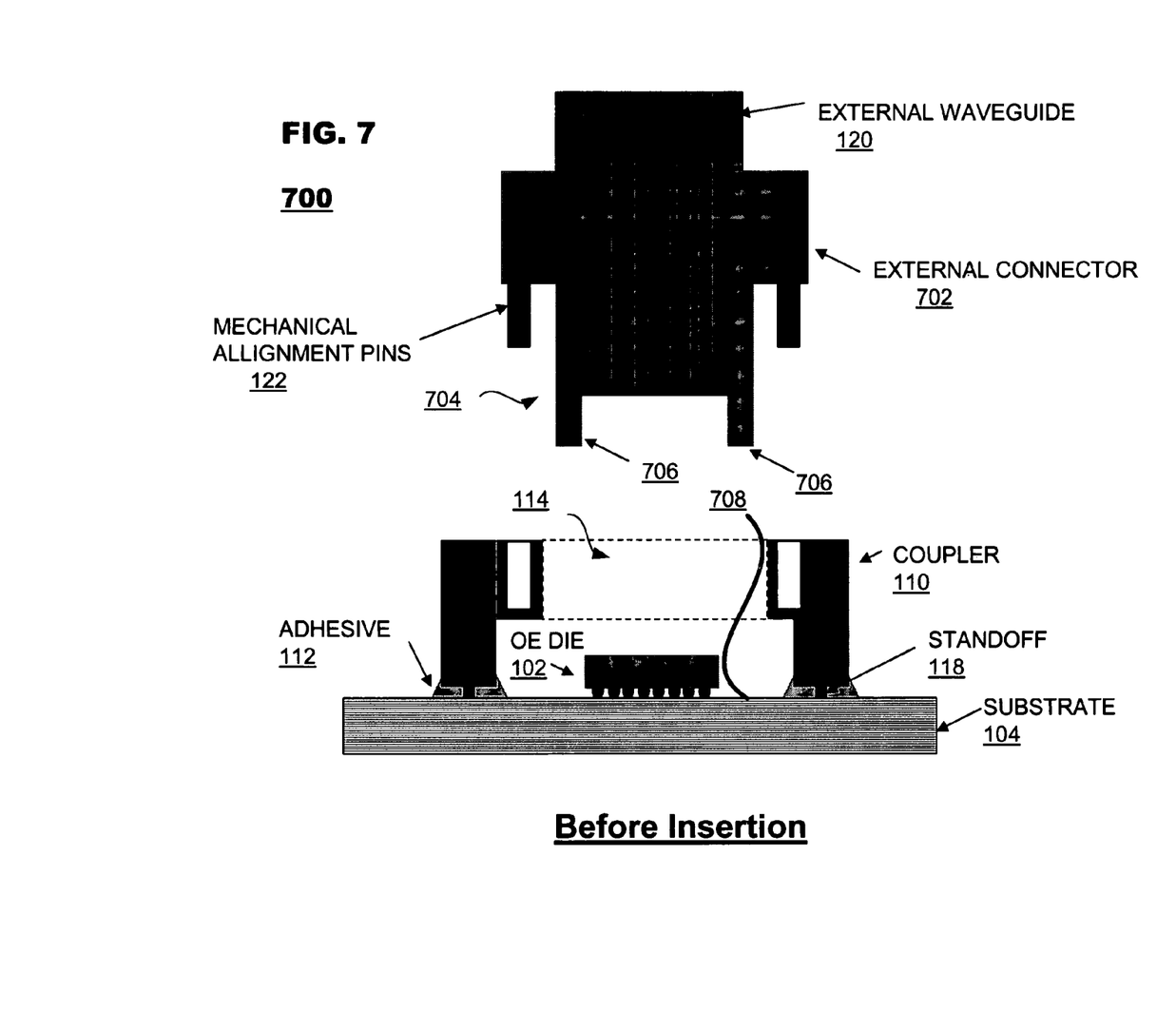
FIG. 7 is a front view of an unassembled optical interconnect according to an alternative embodiment of the invention.

FIG. 7 is a front view of an unassembled optical interconnect 700 according to an alternative embodiment of the invention. In the illustrated embodiment, the interconnect 700 includes the OE die 102 disposed on the substrate 104. The coupler 110 is attached to the substrate 104 by the adhesive 112, which has flowed under the bottom of the coupler 110 and around the standoffs 118 so that the coupler 110 is attached to the substrate 104.

An external connector 702 includes the two mechanical alignment pins 122 and is coupled to the external waveguide 120. In the illustrated embodiment, the external connector 702 also includes an engagement section 704 that is to fit into the coupler port 114. In the illustrated embodiment, the external connector 702 is a standard male MT connector modified in at least one respect in that the engagement section 704 is formed to straddle the OE die 102 and has one or more sections 706 that come to rest on the top surface 708 of the substrate 104.

Figure 8:
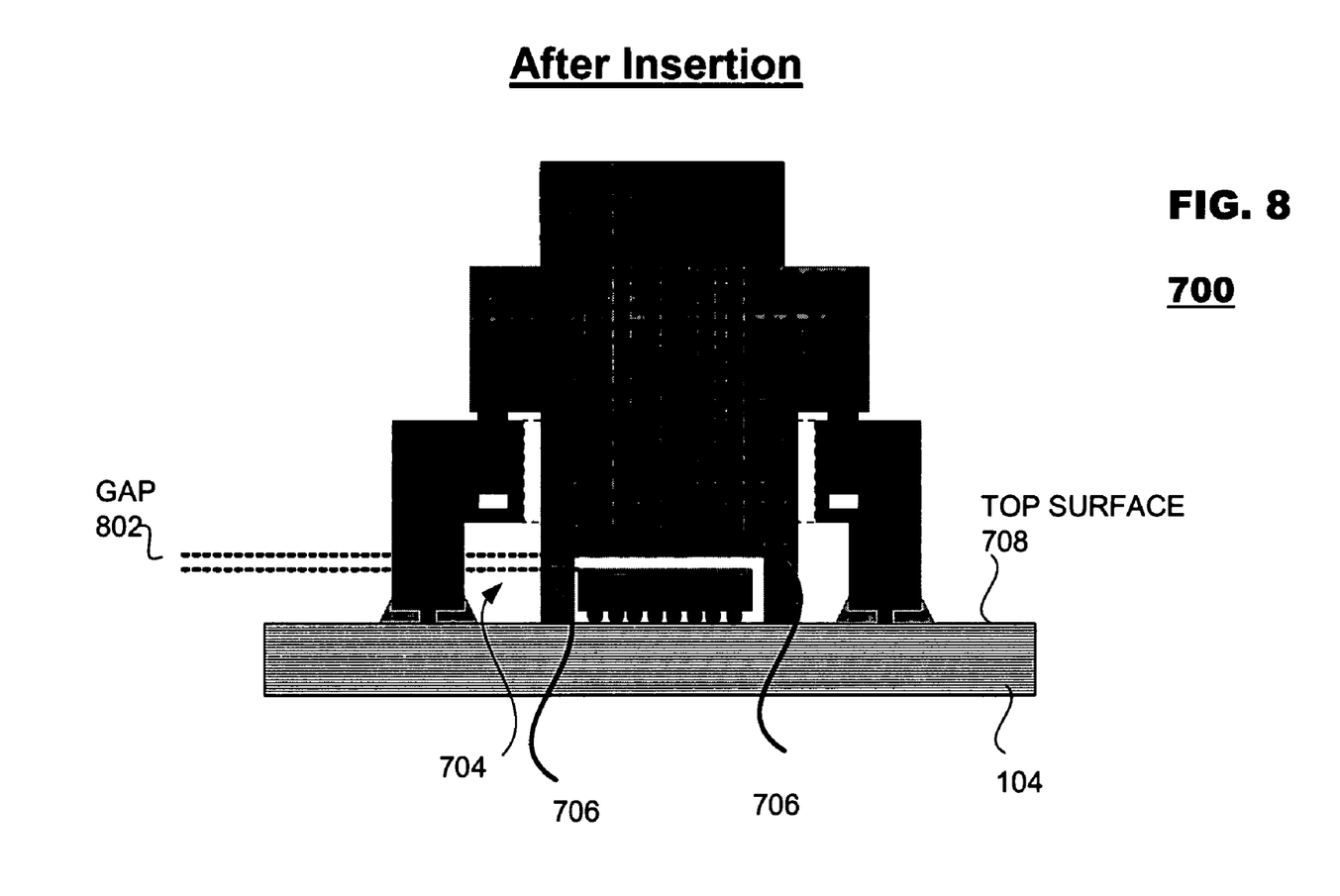
FIG. 8 is a front view of the optical interconnect depicted in FIG. 7 as assembled according to an embodiment of the present invention.

FIG. 8 is a front view of the assembled optical interconnect 700 according to an embodiment of the present invention. In the illustrated embodiment, note that the engagement section 704 straddles the OE die 102 and the sections 706 rest on the top surface 708 of the substrate 104. This creates a vertical gap 802. In this embodiment, the tolerance may be improved because the vertical gap 802 is controlled more directly.

Figure 9:
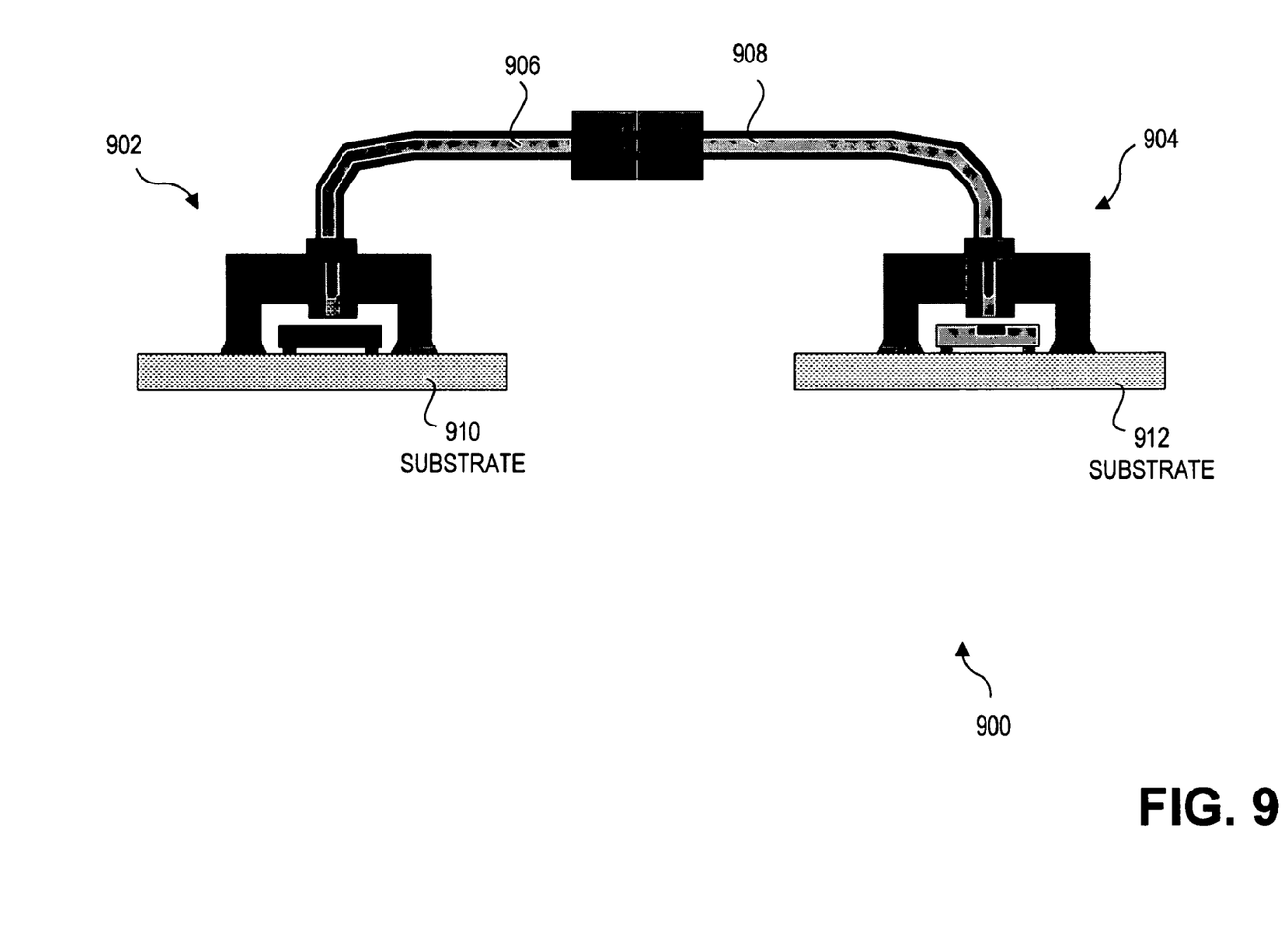
FIG. 9 is a side view of an optical system according to an embodiment of the present invention.

FIG. 9 is a side view of an optical system 900 according to an embodiment of the present invention. The optical system 900 includes a transmitter 902 coupled to a receiver 904 using external waveguides 906 and 908. In one embodiment, transmitter 902 includes a semiconductor laser and receiver 904 includes a photodetector. Substrates 910 and 912 may be the same substrate, such as in chip-to-chip communication on the same board or package, or different substrates, such as communication between two different systems, boards, or packages. External waveguides 906 and 908 may be replaced by a single external waveguide with two modified MT connectors at its two ends. Alternatively, suitable external waveguide assemblies with more than two external connectors may be used to interconnect more than two substrates. In some embodiments, the external waveguide assembly may include a photonic switch, an optical power divider, or the like. Embodiments of the invention may be used in connecting systems, sub-systems, optical modules, daughter cards, backplanes, or the like.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method 600.

A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

In the above description and claims, the term "coupled" and its derivatives may be used. "Coupled" may mean that two or more elements are in direct contact (physically, electrically, magnetically, optically, etc.). "Coupled" may also mean two or more elements are not in direct contact with each other, but still cooperate or interact with each other.

Further, it will be understood that the terms "upper" and "lower" or "top" and "bottom" are used herein for ease of description but do not limit embodiments of the invention to any particular orientation in free space or configuration.

Various operations of embodiments of the present invention are described herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment of the invention.

What is claimed is:

1. An apparatus, comprising:
    a substrate;
    an optoelectronic device disposed in or on the substrate;
    a multi-terminal (MT) connector having a waveguide coupled thereto, the MT connector having a first portion and a second portion to contact a surface of the substrate, the MT connector having further a first alignment pin and a second alignment pin; and
    a precision molded coupler, the coupler having a port to receive the MT connector, the coupler having a first alignment hole and a second alignment hole to mate with the first and second alignment pins, respectively, to passively and laterally align the waveguide to the optoelectronic device, the coupler having standoffs, the standoffs having a predetermined height associated with a predetermined vertical gap between the waveguide and the optoelectronic device, the standoffs being attached to the substrate via ultraviolet (UV) light cured adhesive.

2. The apparatus of claim. 1, further comprising one or more electrically conductive bumps disposed between the optoelectronic device and the substrate, wherein a diameter of the bumps is associated with the predetermined vertical gap between the waveguide and the optoelectronic device.

3. The apparatus of claim 2, wherein the electrically conductive bumps include solder bumps.

4. The apparatus of claim 3, wherein the electrically conductive bumps include at least one of gold stud bumps and copper stud bumps.

5. The apparatus of claim 1, further comprising one or more spring loaded clips disposed. in the coupler port to hold the connector in position. wherein a position of the spring loaded clips is associated with the predetermined vertical gap between the waveguide and the optoelectronic device.

6. The apparatus of claim 1, further comprising one or more mechanical stops disposed in the coupler port to hold the connector in position, wherein a location of the mechanical stops is associated with the predetermined vertical gap between the wave guide and the optoelectronic device.

7. A system, comprising:
    an optical waveguide array;
    a coupler attached to a substrate;
    a connector coupled to the optical waveguide array, the connector having standoffs, the standoffs having predetermined height, the standoffs to rest on the substrate when the connector is inserted into the coupler;
    an optoelectronic device disposed in or on the substrate; and
    the connector standoffs having a predetermined height to create a distance between the substrate and the optical waveguide array to longitudinally align the optical waveguide array with the optoelectronic device in a passive manner;
    wherein the connector is inserted in a coupler port, and wherein the coupler port is to horizontally align the optical waveguide array with the optoelectronic device in a passive manner.

8. The system of claim 7, wherein the coupleris to constrain the connector in at least two translational degrees of freedom.

9. The system of claim 7, wherein the coupler is to constrain the connector in at least two rotational degrees of freedom.

10. The system of claim 7, wherein the connector further comprises one or more mechanical alignment pins, wherein the coupler further comprises one or more mechanical alignment holes, and wherein the mechanical alignment pins along with the mechanical alignment holes are to prevent the connector from yawing.

11. An apparatus, comprising:
    a coupler attached to a substrate;
    a connector coupled to an optical waveguide array, the connector having standoffs to rest on the substrate when the connector is inserted into the coupler; and
    an optoelectronic device disposed in or on the substrate;
    the connector standoffs having a predetermined height associated with a predetermined distance between the substrate and the optical waveguide array to longitudinally align the optical waveguide array with the optoelectronic device in a passive manner, wherein a port in the coupler is to horizontally align the optical waveguide array with the optoelectronic deuce in a passive manner.

12. The apparatus of claim 11, further comprising one or more electrically conductive bumps disposed between the optoelectronic device and the substrate, wherein a diameter of the bumps is associated with the predetermined distance between the substrate and the optical waveguide array.

13. The apparatus of claim 12, wherein the electrically conductive bumps include solder bumps.

14. The apparatus of claim 12, wherein the electrically conductive bumps include at least one of gold stud bumps and copper stud bumps.

* * * * *

UNITED STATES PATENT AND TRADEMARK OFFICE
CERTIFICATE OF CORRECTION

PATENT NO. : 7,344,318 B2 Page 1 of 1
APPLICATION NO. : 11/386149
DATED : March 18, 2008
INVENTOR(S) : Lu et al.

It is certified that error appears in the above-identified patent and that said Letters Patent is hereby corrected as shown below:

In column 7, at line 65, after "disposed" and delete --.--.

Signed and Sealed this

Eleventh Day of November, 2008

JON W. DUDAS
*Director of the United States Patent and Trademark Office*